United States Patent
Qiu et al.

(10) Patent No.: US 9,899,050 B2
(45) Date of Patent: Feb. 20, 2018

(54) MULTIPLE LAYER FEPT STRUCTURE

(71) Applicant: Seagate Technology LLC, Cupertino, CA (US)

(72) Inventors: Jiaoming Qiu, Maple Grove, MN (US); Yonghua Chen, Edina, MN (US); Ganping Ju, Pleasanton, CA (US); Thomas P. Nolan, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/376,043

(22) Filed: Dec. 12, 2016

(65) Prior Publication Data
US 2017/0092317 A1 Mar. 30, 2017

Related U.S. Application Data

(60) Continuation of application No. 13/836,521, filed on Mar. 15, 2013, now Pat. No. 9,520,151, which is a
(Continued)

(51) Int. Cl.
*G11B 5/84* (2006.01)
*G11B 5/85* (2006.01)
(Continued)

(52) U.S. Cl.
CPC .......... *G11B 5/85* (2013.01); *B32B 15/01* (2013.01); *C22C 5/04* (2013.01); *C22F 1/14* (2013.01);
(Continued)

(58) Field of Classification Search
CPC ............... C21D 1/26; G11B 5/84; G11B 5/85
(Continued)

(56) References Cited

U.S. PATENT DOCUMENTS 6,555,252 B2   4/2003   Sellmyer et al.
6,605,321 B1   8/2003   Ravelosona-Ramasitera et al.
(Continued)

FOREIGN PATENT DOCUMENTS

WO    09412681    6/1994

OTHER PUBLICATIONS

M. H. Hong, et al. "Microstructure of FePt/Pt magnetic thin films with high perpendicular coercivity," Journal of Applied Physics, vol. 84, No. 8 Oct. 15, 1998, pp. 4403-4409.
(Continued)

*Primary Examiner* — Brian Walck
(74) *Attorney, Agent, or Firm* — Hall Estill Attorneys at Law

(57) ABSTRACT

One embodiment described herein is directed to a method involving depositing a seed layer on a substrate, the seed layer comprising A1 phase FePt with a ratio of Pt of Fe greater than 1:1. A main layer is deposited on the seed layer, the main layer comprising A1 phase FePt with a ratio of Pt to Fe of approximately 1:1. A cap layer is deposited on the main layer, the cap layer comprising A1 phase FePt with a ratio of Pt to Fe of less than 1:1. The seed, main and cap layers are annealed to convert the A1 phase FePt to $L1_0$ phase FePt having a graded FePt structure of varying stoichimetry from approximately $Fe_{50}Pt_{50}$ adjacent a lower portion of the structure proximate the substrate to $Fe_{>50}Pt_{<50}$ adjacent an upper portion of the structure opposite the lower portion.

20 Claims, 6 Drawing Sheets

Related U.S. Application Data continuation-in-part of application No. 13/418,167, filed on Mar. 12, 2012, now abandoned, which is a division of application No. 12/369,844, filed on Feb. 12, 2009, now Pat. No. 8,133,332.

(51) Int. Cl.

| | |
|---|---|
| *C21D 1/26* | (2006.01) |
| *B32B 15/01* | (2006.01) |
| *C22C 5/04* | (2006.01) |
| *C22F 1/14* | (2006.01) |
| *C23C 14/16* | (2006.01) |
| *C23C 14/34* | (2006.01) |
| *C23C 14/35* | (2006.01) |
| *C23C 14/22* | (2006.01) |
| *C23C 14/28* | (2006.01) |
| *C23C 14/58* | (2006.01) |
| *G11B 5/65* | (2006.01) |
| *G11B 5/73* | (2006.01) |
| *G11B 5/851* | (2006.01) |

(52) U.S. Cl.
CPC .......... *C23C 14/165* (2013.01); *C23C 14/221* (2013.01); *C23C 14/28* (2013.01); *C23C 14/3464* (2013.01); *C23C 14/35* (2013.01); *C23C 14/5806* (2013.01); *C23C 14/5833* (2013.01); *C23C 14/5873* (2013.01); *G11B 5/653* (2013.01); *G11B 5/732* (2013.01); *G11B 5/851* (2013.01); *B32B 2307/208* (2013.01); *B32B 2307/706* (2013.01); *B32B 2457/00* (2013.01)

(58) Field of Classification Search
USPC .................. 148/527, 529, 530; 427/127–132
See application file for complete search history.

(56) References Cited

U.S. PATENT DOCUMENTS

| | | |
|---|---|---|
| 2003/0113582 A1 | 6/2003 | Litvinov et al. |
| 2004/0053078 A1 | 3/2004 | Lu et al. |
| 2004/0191578 A1 | 9/2004 | Chen et al. |
| 2006/0188743 A1 | 8/2006 | Seki et al. |
| 2006/0269797 A1 | 11/2006 | Lu et al. |
| 2007/0172705 A1 | 7/2007 | Weller et al. |
| 2008/0075931 A1 | 3/2008 | Matsui |
| 2008/0088980 A1 | 4/2008 | Kitagawa et al. |
| 2008/0254322 A1 | 10/2008 | Klemmer et al. |
| 2009/0040644 A1 | 2/2009 | Lu et al. |
| 2009/0161255 A1 | 6/2009 | Maeda |
| 2010/0110577 A1 | 5/2010 | Weller et al. |
| 2010/0149676 A1 | 6/2010 | Khizorev et al. |
| 2011/0019305 A1 | 1/2011 | Suss et al. |
| 2011/0235205 A9 | 9/2011 | Lu et al. |
| 2012/0171519 A1 | 7/2012 | Qui et al. |

OTHER PUBLICATIONS

D. J. Sellmyer, et al., "High-Anisotropy Nanocomposite Films for Magnetic Recording," IEEE Transactions on Magnetics, vol. 37, No. 4, Jul. 2001, pp. 1286-1291.

MULTIPLE LAYER FEPT STRUCTURE

RELATED APPLICATIONS

This application is a continuation of copending U.S. patent application Ser. No. 13/836,521 filed on Mar. 15, 2013, which issues as U.S. Pat. No. 9,520,151 on Dec. 13, 2016 and which is a continuation-in-part of U.S. patent application Ser. No. 13/418,167, filed Mar. 12, 2012, which is a divisional of U.S. Pat. No. 8,133,332 issued Mar. 13, 2012, the content of which are incorporated herein by reference in its entirety.

BACKGROUND

Materials with increased magnetic anisotropies are used in various applications such as, for example, applications in the data storage industry where there is a continuing goal to increase storage densities. Data storage media that can store information at densities above 1 Tbit/in$^2$ may require materials with magnetic anisotropies greater than conventional media materials.

SUMMARY

One embodiment described herein is directed to a method involving depositing a seed layer on a substrate, the seed layer comprising A1 phase FePt with a ratio of Pt of Fe greater than 1:1. A main layer is deposited on the seed layer, the main layer comprising A1 phase FePt with a ratio of Pt to Fe of approximately 1:1. A cap layer is deposited on the main layer, the cap layer comprising A1 phase FePt with a ratio of Pt to Fe of less than 1:1. The seed, main and cap layers are annealed to convert the A1 phase FePt to $L1_0$ phase FePt having a graded FePt structure of varying stoichimetry from approximately $Fe_{50}Pt_{50}$ adjacent a lower portion of the structure proximate the substrate to $Fe_{>50}Pt_{<50}$ adjacent an upper portion of the structure opposite the lower portion.

DETAILED DESCRIPTION

Figure 1:
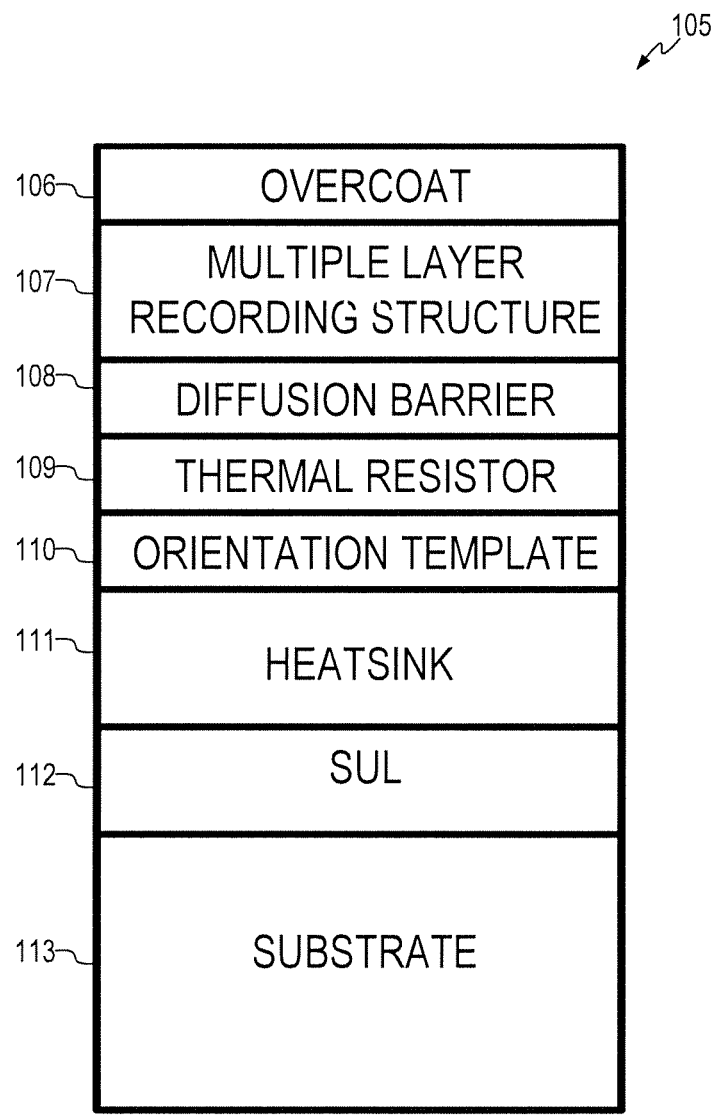
FIG. 1 is a diagram illustrating an arrangement of a perpendicular medium according to an example embodiment.

There are known bulk permanent magnetic materials having crystalline phases with magnetocrystalline anisotropy that can store information at densities greater than 1 Tbit/in$^2$. For bulk permanent magnetic materials, special heat treatments are typically used to control the phase formation and microstructure to optimize the material properties. In order to incorporate these materials into a data storage media, the correct crystalline phase must be obtained within a microstructure of fine, nanocrystalline, exchange decoupled or partially exchange decoupled grains while maintaining thermal stability.

$L1_0$ phase FePt containing alloys have magnetocrystalline anisotropy as high as $7\times10^7$ erg/cc, which is well suitable for magnetic recording media to achieve density over 1 Tb/in$^2$. However, FePt typically forms the face centered cubic (fcc) phase (i.e., the A1 phase) when deposited at room temperature, and annealing is required to transform (i.e., chemically order) the material into the high anisotropy $L1_0$ phase.

This high temperature processing enhances diffusion, which can affect grain growth, grain morphology, grain segregation, and grain composition through intermixing. On the other hand, growth oriented [001], fully ordered L10, exchange decoupled FePt containing alloy media can have a coercivity over 4 Tesla, which is beyond current writer technology capabilities. One goal is to produce oriented, FePt containing media with a small grain size and with magnetic characteristics that are compatible with current writer technology. A second goal is to produce oriented, FePt containing media with a small grain size and with magnetic characteristics that are compatible with write assisted recording technology such as heat-assisted magnetic recording (HAMR).

The present disclosure is directed to a method of fabricating a data storage media that uses a multiple layer structure including seed and/or cap layers on top and/or bottom of an FePt containing recording layer, and anneals the multiple layer structure to convert it from A1 structure to predominantly FePt containing $L1_0$ phase material at a relatively low anneal temperature.

Taking advantage of the ability to intermix the seed layer and main recording layer upon annealing and form a graded composition L10 structure, the seed layer may be selected to optimize and set recording layer properties including the initial growth, grain size, roughness, orientation, ordering temperature, segregation, and magnetic moment of the recording layer without significantly damaging the post-annealing properties of the full layer stack. Further, the seed layer may be designed to provide desired, vertically non-uniform properties of the recording layer that are achieved only after the annealing process to form the L10 structure is completed; thus achieving desired gradient of magnetic properties such as anisotropy field (Hk), saturation magnetic moment (Ms), and Curie temperature (Tc), to form so-called ECC (exchange coupled composite) and graded moment HAMR media designs.

A top layer comprising a different material composition than the main recording layer can similarly be used to intermix with the main recording layer upon annealing, and form an L10 structure with graded composition, microstructure, and magnetic and thermal properties. Along with achieving desired gradients of magnetic properties including Hk, Ms, and Tc, for ECC and graded moment media, the segregation of the top layer may be adjusted to reduce the resulting Hex and roughness after annealing, and form a so-called CGC (continuous granular composite) media design.

Figure 3A:
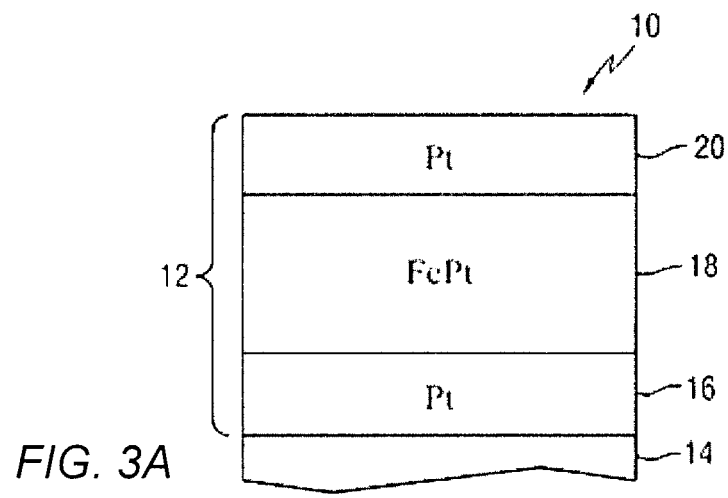
FIG. 3A is a side elevation view of a material stack used in a first embodiment.

FIG. 3A is a side elevation view of a material stack 10 used in a first embodiment. A multiple layer structure 12 is formed on a substrate 14. The multiple layer structure includes a first layer 16 (e.g., a seed layer) of Pt, a first layer 18 of A1 phase FePt on the first layer of Pt, and a second layer 20 (e.g., a cap layer) of Pt on the layer of FePt. The substrate can be, for example, glass, aluminum or its alloys, etc. The layers can be formed by physical vapor deposition methods, such as magnetron sputtering, pulsed laser deposition, or ion beam deposition.

In one example, layer 16 can have a thickness ranging from about 0.5 nm to about 5 nm. Layer 18 can have a thickness ranging from about 2 nm to about 10 nm. Layer 20 can have a thickness ranging from about 0.5 nm to about 5 nm.

The multiple layer structure is annealed to convert the A1 phase FePt to $L1_0$ phase FePt. In one example, the annealing step can be performed at about 300° C. for 4 hours. In other examples, the annealing temperature can be in a range from about 200° C. to about 600° C. The annealing temperature to convert the A1 phase FePt to $L1_0$ phase FePt may depend on the layer thicknesses and annealing times. Portions or all of the seed layer and cap layer may also interdiffuse during annealing, and may also transform to L10 structure and form high anisotropy material. The annealing process may occur in-situ, concurrent with layer deposition, by depositing on a heated substrate.

In reference now to FIG. 1, a diagram illustrates a perpendicular recording medium 105 according to an example embodiment. The medium 105 may include multiple underlayers between the substrate 113 and the multiple layer FePt containing recording structure 107. Such embodiments may further include an adhesion layer (not shown), a soft underlayer (SUL) 112, a heatsink layer (HS) 111, a thermal resistor 109, an orientation layer 110, and a diffusion barrier 108.

The adhesion layer, if needed, generally includes an amorphous metal layer that adheres well to the (glass) substrate 113. The SUL 112 often includes a high $M_s$ low anisotropy material generally having $H_c$<100 Oe. Such materials often include at least one of Fe and Co, and elements promoting an amorphous structure at room temperature, of which Ta, B, Zr, W are common selections. The heatsink layer 111 is used to carry heat away from the active region of the media and increase temperature gradient. Appropriate materials for the heatsink layer 111 have high heat conductivity and compatible microstructure and film growth properties. Some high conductivity options include Cu, Ag, Au, Mo, Ru, W, V, and their alloys.

Above the heatsink 111, additional layers are provided that accomplish multiple purposes; to provide a template for <001> growth and grain isolation of the magnetic layers, to prevent interdiffusion of heatsink material into the magnetic layers, and to act as a thermal resistor that controls the flow of heat into the heatsink. Some presently preferred embodiments employ an MgO containing layer that accomplishes all of these tasks. Other embodiments may use one or more different layers to accomplish these tasks. On top of these layers, the multiple layer Fe—Pt containing recording structure 107 is deposited and annealed, to form an L10 phase with c-axis and anisotropy axis oriented perpendicular to the substrate plane; A protective overcoat 106 and lubrication are subsequently applied. The overcoat 106 may be formed from a diamond-like carbon material.

Figure 2:
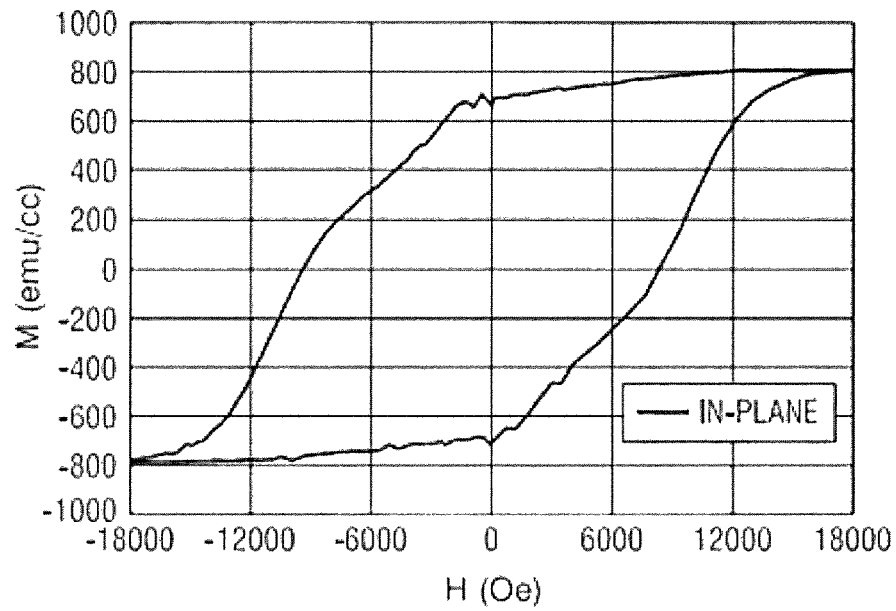
FIG. 2 is a graph of a hysteresis loop for materials that can be used in the material stack of FIG. 1.

FIG. 2 is a graph of magnetization versus applied magnetic field (i.e., a hysteresis loop) for a multiple layer structure as shown in FIG. 1 in which the FePt layer comprises $Fe_{62}Pt_{38}$. During annealing, there may be some diffusion between the layers, which depends on annealing process, time, and temperature used.

FIG. 2 shows a coercivity of about 9130 Oe for the multiple layer structure. The hysteresis loop was measured by monitoring the magnetic moment change while the applied field is sweeping from −18000 Oe to +18000 Oe and then swept backwards using a vibrating sample magnetometer (VSM) at room temperature. The magnetic field was applied with its direction parallel to the film plane, which is called an in-plane measurement, and the coercivity is then called the in-plane coercivity.

Figure 3B:
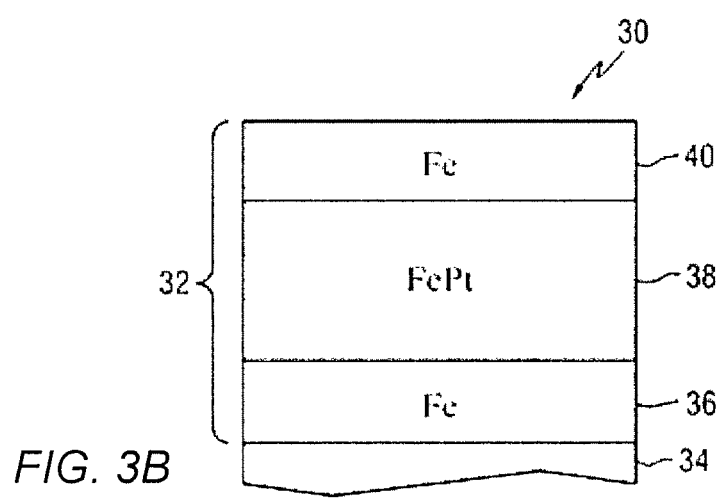
FIG. 3B is a side elevation view of another material stack used in another embodiment.

FIG. 3B is a side elevation view of a material stack 30 used in another embodiment. A multiple layer structure 32 is formed on a substrate 34. The multiple layer structure includes a first layer 36 (e.g., a seed layer) of Fe, a first layer 38 of A1 phase FePt containing alloy on the first layer of Fe, and a second layer 40 (e.g., a cap layer) of Fe on the layer of FePt containing alloy. The multiple layer structure is annealed to convert the A1 phase FePt containing alloy to $L1_0$ phase FePt containing alloy. The substrate can be, for example, glass, aluminum or its alloys, etc.

In one example, layer 36 can have a thickness ranging from about 0.5 nm to about 5 nm. Layer 38 can have a thickness ranging from about 2 nm to about 10 nm. Layer 40 can have a thickness ranging from about 0.5 nm to about 5 nm.

The multiple layer structure is annealed to convert the A1 phase FePt containing alloy to $L1_0$ phase FePt containing alloy. In one example, the annealing step can be performed at about 300° C. for 4 hours. In other examples, the annealing temperature can be in a range from about 200° C. to about 600° C. The annealing temperature used to convert the A1 phase FePt containing alloy to $L1_0$ phase FePt depends on the layer thicknesses and annealing times. The annealing process may occur in-situ, concurrent with layer deposition, by depositing on a heated substrate. Portions or all of the seed layer and cap layer may also interdiffuse during annealing, and may also transform to L10 structure and form high anisotropy material.

Figure 4:
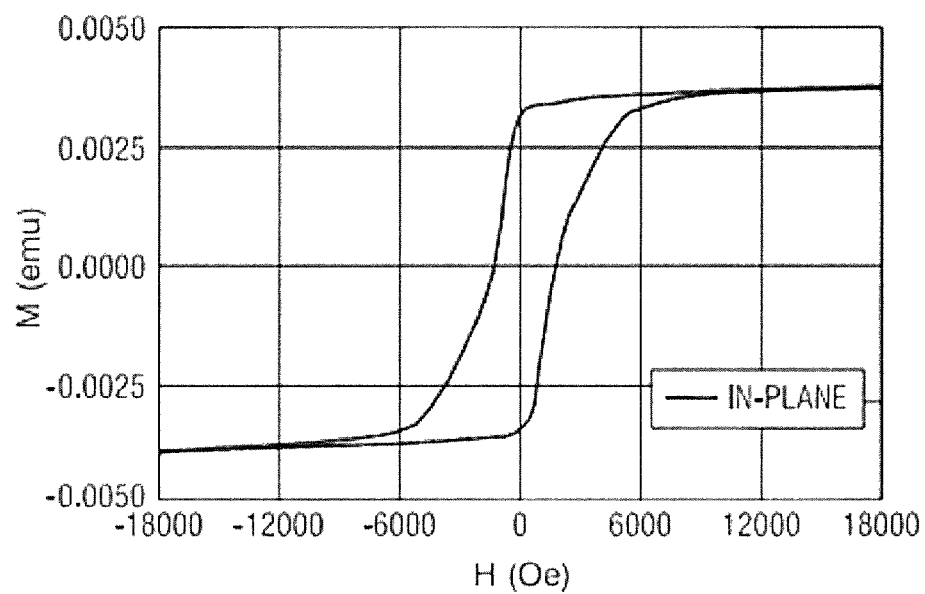
FIG. 4 is a graph of a typical hysteresis loop for materials that can be used in the material stack of FIG. 3.

FIG. 4 is a graph of magnetization versus applied magnetic field for a multiple layer structure of FIG. 3 in which the FePt containing alloy layer comprises $Fe_{36}Pt_{64}$. FIG. 4 shows a coercivity of about 1800 Oe for the multiple layer structure.

In the examples of FIGS. 1 and 3, atom diffusion at the two interfaces, between the seed layer and the FePt containing alloy layer, and between the cap layer and FePt containing alloy layer, facilitates the chemical ordering process for the whole stack.

The platinum seed and cap combination of FIG. 1 is suitable for an iron rich FePt containing alloy middle layer, as diffusion may drive the whole film towards the stoichiometric composition of 50 to 50. In one example using platinum as the seed and cap layer, an in-plane coercivity value of 9130 Oe has been achieved after annealing at a temperature as low as 300° C. Similarly, the iron seed and cap combination of FIG. 3 is effective for ordering a platinum rich FePt containing alloy middle layer.

Media grain size is reduced as the annealing temperature decreases. Thus the use of a low annealing temperature would limit the media grain size. A successful low temperature phase transformation method ensures small grain size for high recording areal density.

Since the inter-diffusion occurs in a direction perpendicular to the plane of the films, grain isolation materials such as $SiO_2$, carbon, boron, or other oxide or nitride material can be applied to keep the FePt containing alloy grain size within several nm. These grain isolation materials can be applied by embedding them into the target material, and/or through co-sputtering from a separate target in the same chamber.

Figure 5:
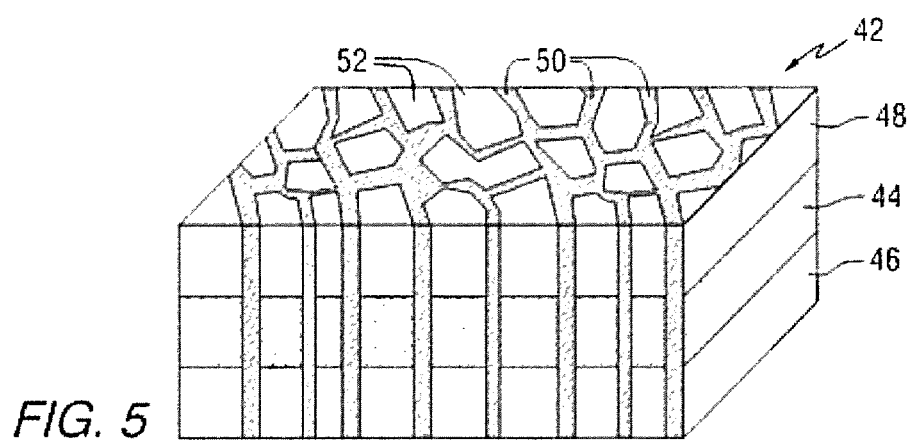
FIG. 5 is a schematic representation of a granular media.

FIG. 5 is a schematic drawing of a media 42 having an FePt containing alloy layer 44 between Pt seed and cap layers 46, 48. Grain isolation material 50 is shown to be positioned between grains 52 in the stack.

In another aspect, a data storage media is provided with enhanced writability. One way to enhance writability is to form so-called Exchange-Coupled Composite (ECC) or Domain Wall Assisted Magnetic Recording (DWAMR) media. ECC media include one magnetically hard phase (in this case ordered $L1_0$ FePt containing alloy) and one magnetically softer phase, which can be disordered or partially ordered FePt containing alloy or other high magnetization materials such as FeNi, FeCo, etc. As used in this description, for conventional magnetic recording, a magnetically hard material is a material that typically has a coercive force higher than 2000 Oe, and a magnetically soft material is a material that typically has a coercive force lower than 2000 Oe. For media designed for Heat-Assisted Magnetic Recording (HAMR), the definition of a hard and soft layer for ECC or DWAMR media requires more care. Because the switching process and the effective switching rely on a temperature change and because the effective head field gradient is in a large part controlled by the temperature gradient, the "softer layer" in a HAMR recording system is in part the material with the lower Curie temperature (Tc), and in part the material with the lower magneto-crystalline anisotropy field (Hk) or high temperature switching field {Hsw(T)}. Thus the HAMR ECC softer and harder layers are more easily specified by different values of either Tc or Hk, rather than a room temperature coercive force. The softer phase of similar FePt containing alloys may be observable as having lower ordering parameter, Fe—Pt stoichiometry such that the Fe:Pt ratio is significantly different than 1:1, or by addition of other alloying elements such as Cu or Ni (though others are practicable) that lower Hk and Tc compared to a similar pure FePt alloy.

To make ECC media, the softer phase material is deposited over the $L1_0$ FePt containing alloy. An optional thin exchange coupling control layer of another material can be deposited before the soft phase material such that the exchange coupling control layer is positioned between the hard and soft layers to tune the interlayer exchange coupling strength. The exchange coupling control layer can be, for example, Pt, PtSi, Pd, or PdSi, or a low Ms FePt containing alloy. In some embodiments, the cap layer may comprise the exchange control layer.

Figure 6:
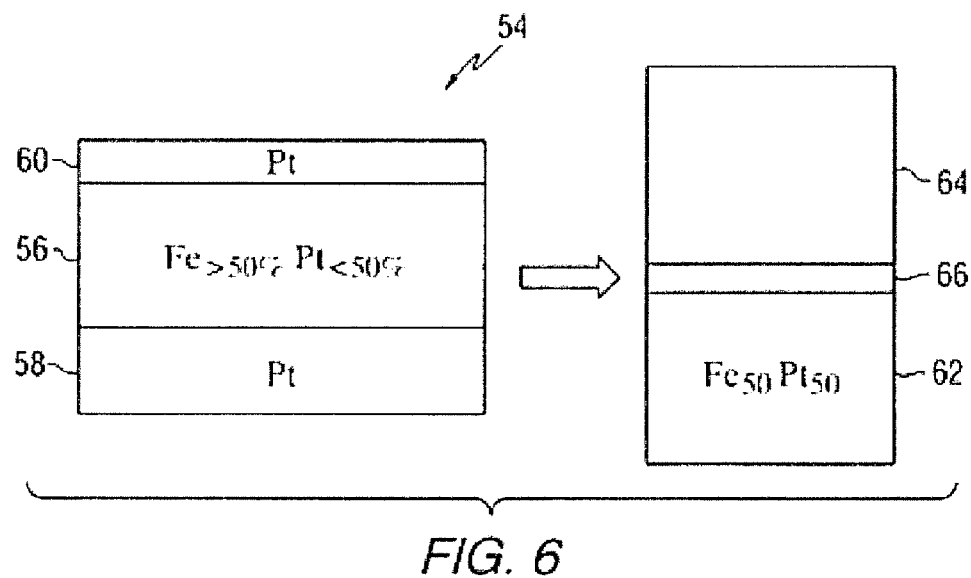
FIG. 6 is a schematic representation of a process for producing exchange coupled composite media.

FIG. 6 is a schematic representation of a process for producing exchange coupled composite media. The process starts with a material stack 54 including a FePt containing alloy layer 56 sandwiched in between two Pt layers 58, 60, which is annealed to convert the FePt to the $L1_0$ phase in later 62. Next, the cap layer is removed, for example, by plasma etching (e.g., sputtering) or ion beam milling (e.g., ion bombardment). Then a magnetically softer layer 64 is deposited over the ordered FePt containing alloy hard layer. Optionally, a thin layer 66 of Pt, Pd, or some non-magnetic or low Ms material such as silicon containing material, can be deposited over the ordered FePt containing alloy hard layer prior to the deposition of the magnetically softer layer to control the exchange coupling between the soft or hard layer. The bottom Pt partially diffuses into FePt containing alloy, any leftover of Pt would be minimal and non-ferromagnetic so it should not affect media magnetic property.

FIG. 6 shows the use of an iron rich middle layer that is converted to a stoichiometric composition of about 50 to 50; Fe:Pt~1. Such conversion can be implemented by annealing. Annealing may involve a post-deposition heating of the multiple layer structure in a vacuum chamber. Alternatively, annealing may involve heating the multiple layer structure by heating the substrate prior to or concurrent with deposition of the FePt containing alloy layer(s) so that the annealing process begins as soon as the atoms of the multiple layer structure are deposited. It should be noted that the temperature of the substrate may be different from what is sometimes referred to as the "deposition temperature." The deposition temperature may include the temperature of the plasma, which is quite high, or the average adatom energy in electron-volts, which translates to a temperature. In the present embodiments, the adatoms arrive by the deposition process, and then begin the annealing process after contact with the substrate. In such a case, the annealing temperature may be defined by the temperature of the substrate they reside on.

In another aspect, a graded anisotropy (GA) media is proposed to address the writability issue. Inter-diffusion of iron and platinum atoms is used to produce a composition gradient as well as a chemical ordering gradient, which in turn provides an anisotropy gradient.

Figure 7:
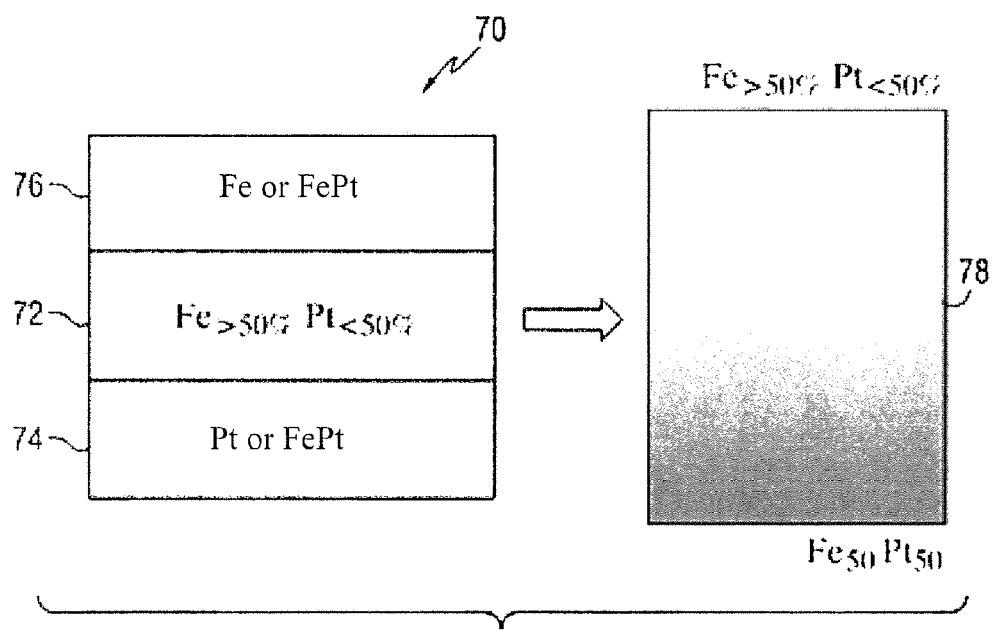
FIG. 7 is a schematic representation of a process for producing graded anisotropy media.

FIG. 7 is a schematic representation of a process for producing graded anisotropy media. The process starts with a material stack 70 including an iron rich FePt containing alloy layer 72 sandwiched in between a Pt seed layer 74 and a Fe cap layer 76. The stack is annealed to produce a graded layer 78 having a substantially stoichiometric composition of 50 to 50 (Fe:Pt~1) near the bottom and an iron rich composition (Fe:Pt>1) near the top. Such conversion can also be implemented by annealing in the form of heating the substrate prior to or concurrent with deposition of layers 72, 74, and 76 so that the annealing process begins as soon as the atoms of the multiple layer structure are deposited. It is well known that a concentration gradient can help the interdiffusion of atoms of different elements. In the annealing process, thermal energy helps to create vacancies and enhance the mobility of atoms to allow for atomic reorganization. The gradient can be tuned by adjusting seed and cap thickness and composition, as well as by adjusting the annealing temperature or time.

FePt containing alloy media anisotropy strongly depends on the composition, and maximizes around $Fe_{50-55}Pt_{50-45}$ (Fe:Pt~1). The anisotropy decreases when the material composition is off stoichiometry. For the purposes of this description, perfect $L1_0$ FePt stoichiometry refers to $Fe_{50}Pt_{50}$ (Fe:Pt=1).

With the process of FIG. 7, it is possible to establish gradient anisotropy media with a composition gradient. This can be, for example, achieved by using Pt diffusion from the bottom and Fe diffusion from the top layer, and results in close to equal stoichiometry at the bottom (high anisotropy, K) and an Fe rich composition on the top (low anisotropy, K). A similar approach can be implemented by sandwiching iron deficient FePt containing alloy film between a Fe or Fe-rich seed layer and a Pt or Pt-rich cap layer, with Fe diffusion from the bottom and Pt diffusion from the top.

Some embodiments of the invention include a magnetic recording layer that has been transformed from A1 to $L1_0$ crystal structure by annealing the multiple layer thin film stack in a vacuum chamber at temperatures as low as 300° C., applied after deposition of the layers onto a substrate has been completed.

There are alternative annealing procedures that may be applied to a multiple layer structure so as to transform the A1 FePt containing alloy structure to $L1_0$ and provide an effective high anisotropy magnetic recording layer. One such embodiment is to heat a substrate prior to (or during) deposition of the multiple layer structure. The heat diffuses from the substrate into the layers as they are deposited, thus providing the annealing.

As described below, embodiments such as shown in FIGS. 6 and 7 may be formed using alternate structures and manufacturing techniques. These variations may result in the magnetic recording layer (e.g., FePt containing layers 56 and 72 in FIGS. 6 and 7, respectively) having an increased magnetic moment, increased light absorption, altered Curie temperature, and enhanced c-axis orientation. These variations may also facilitate incorporation of segregant/isolation materials into the magnetic recording layer.

For example, increased magnetic moment ($M_s$) in the magnetic recording layer can be achieved by raising the Fe:Pt ratio to a value larger than 1:1 and by reducing the amount of segregant material in the magnetic layer. Combining these factors, a graded recording layer with regions combining high moment and low segregant volume may significantly increase measured remanant moment ($M_r t$).

As shown in FIG. 7, some embodiments include a Pt (seed) layer 74 at the bottom of the multiple layer stack 70, that assists $L1_0$ ordering as it partially interdiffuses into the first FePt containing alloy layer 72 to form a recording layer 78 with graded Fe:Pt ratio, and accordingly graded anisotropy and graded magnetic moment. Such diffusion may not necessarily require a pure Pt seed layer, but may be achievable with a seed layer 74 that has a different Fe:Pt ratio than the first layer 72 so that there is a driving force for diffusion. The seed layer 74 can also include nonmagnetic segregating/isolating materials that separate the magnetic grains at grain boundaries (see isolation material 50 in FIG. 5), but do not change the Fe:Pt ratio of the layer 74. For stability during high temperature annealing, nonmagnetic materials such as carbon, carbides, boron and borides, oxides, and nitrides may be used as segregation/isolation materials. Metals above their solubility limit may also be employed.

An FePt containing bottom/seed layer 74 has many useful features. High percentage Pt materials (Fe:Pt<<1) have been found to be better templates for crystallographically oriented growth of FePt than high percentage Fe materials (Fe:Pt>>1). An isolated grain template enables growing subsequent isolated grain layers with less required segregation material. Bottom layers 74 containing Fe and Pt can form ordered material with less annealing and are less affected by incomplete diffusion of Pt than is a 100% Pt seed layer, thus increasing the flexibility of adjusting gradations of the Fe:Pt ratio in the final recording layer after completion of annealing. High percentage Pt materials also generally absorb more light, increasing the laser heating of the recording layer and reducing the transmitted light absorbed in the heatsink or substrate. This reduces the heat-assisted laser power and increases the temperature gradient; both can enhance performance of present HAMR recording system designs.

Similarly, a top (cap) layer can include an Fe or Pt layer as represented by layers 20 and 40 in FIGS. 3A and 3B. In other embodiments, cap layers may also include Fe and Pt in a stoichiometric ratio different than that of the middle (first) layer 72 so that there is diffusion upon annealing that forms an ordered FePt containing alloy with graded composition. One example embodiment, shown in FIG. 7, includes a cap layer 76 made of FePt having a higher Fe:Pt ratio than middle layer 72. The cap layer 76 may also include a lower segregant concentration than the middle layer 72. The FePt containing alloy cap layer 76 may provide, after annealing, a graded magnetic recording design with a high moment upper region owing to higher Fe concentration and lower segregant concentration as compared to the lower portion of the recording layer. This enables a thinner total thickness of the recording layer and decreases the effective HMS (head-to-media spacing) because the center of moment of the layer is raised. Further, such methods can be combined to employ layers 72, 74, and 76 to form a post-annealing example embodiment that comprises L10 phase throughout the multiple layer recording stack, and a graded microstructure including highest $M_s$ at the top of the stack, highest absorption at the bottom of the stack, and a highest anisotropy Fe:Pt=1.0 region in between.

Another property that can be usefully tuned by grading composition with addition of Fe-rich or Pt-rich caps and seed layers is Curie temperature, Tc. Curie temperature has been measured to decrease more rapidly as composition becomes Pt-rich than when it is Fe-rich. Thus, the described method can also be used to form a structure that is graded with respect to Tc, and correspondingly to the anisotropy at an elevated recording temperature, such as is used in HAMR.

Copper is known to be capable to add substitutionally into the FePt lattice and maintain the L10 ordered structure while rapidly reducing Tc. Ni and other metallic elements can also act in this manner. In some preferred embodiments, the strength of the graded Tc can be significantly enhanced and controlled by addition of Cu to the Pt-rich or Fe-Rich seed and cap layers, and subsequent diffusion of Cu into the L10 structure that is formed after annealing. By this manner, embodiments of the invention are enabled to provide even more strongly graded Hk(t) as desired for so-called ECC media.

Figure 8:
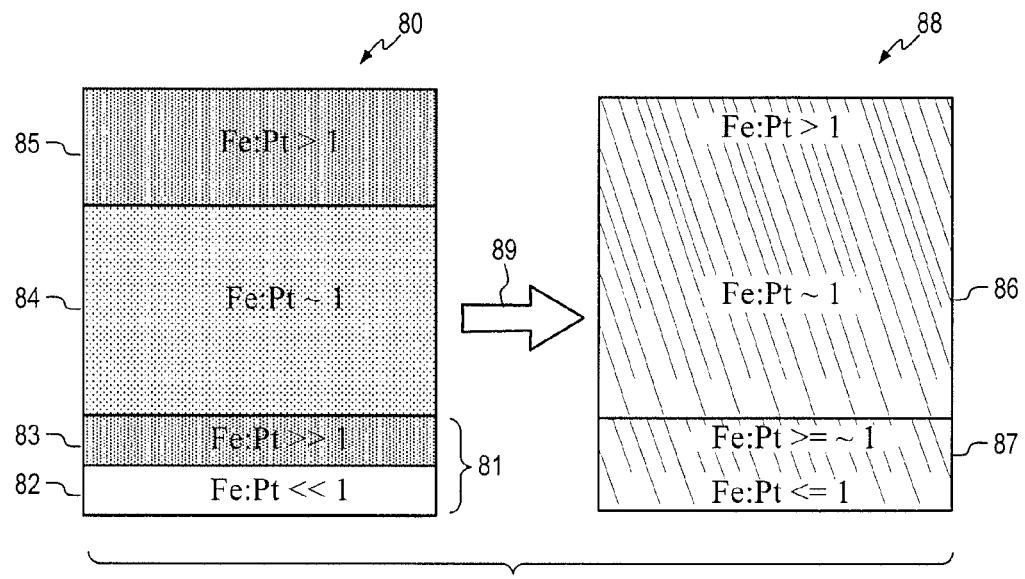
FIGS. 8 and 9 are schematic representations of a structure and process for producing graded anisotropy media according to an example embodiment.

In reference now to FIG. 8, a schematic represents a structure and process for producing graded anisotropy media according to an example embodiment. In this embodiment, a material stack 80 includes a composite seed layer 81 at the bottom. The seed layer 81 may include at least a portion of FePt containing alloy having a stoichiometry different than the subsequent layers (e.g., main layer 84). The seed layer 81 is shown here as a multiple layer structure (e.g., bilayer) with a lower portion 82 proximate the substrate or underlayers (not shown) beneath an upper portion 83. It will be appreciated that the seed layer 81 may alternatively be formed as a single layer of FePt containing alloy, e.g., with at least a portion having a higher concentration of Pt than Fe so as to increase optical absorption. The seed layer 81, whether a single or multiple layer structure, may also include any of Au, Ag, Ru, Pd, Pt, V, Mo, W, etc., so as to increase optical absorption. Whether a single or multiple layer structure, the seed layer 81 may also optionally include segregation material. The Curie temperature can be controlled by addition of Cu to the seed layer 81.

The lower portion 82 of the seed layer 81 is formed from a nonmagnetic Pt or low Fe:Pt ratio alloy having similar orientation, optical absorption, and optionally segregation properties as previously described. The upper portion 83 of seed layer 81 is formed of a high Fe:Pt ratio material, and faces the second, main Fe:Pt layer 84. The main Fe:Pt layer 84 has a stoichiometry different than the seed layer 81, e.g., with an approximately 50/50 ratio of Fe to Pt. The main layer 84 is also generally thicker than the seed layer 81. The main layer 84 is deposited as A1 phase FePt, and is annealed (e.g., contemporaneously with deposition) in order to form the desired $L1_0$ phase FePt layer.

A high ratio Fe:Pt cap layer 85 completes the structure, the cap layer 85 being generally thicker than the main layer 84. The cap layer 85 may be a single or multiple layer structure, and may also optionally include segregation material. The Curie temperature can be controlled by addition of Cu to the cap layer 85. In this case, it may be better to grade anisotropy by going to Fe:Pt>1 or Fe:Pt>>1 than by reducing annealing to get disorder. This structure with FePt containing alloy layers of differing stoichiometry enables the desired template properties of the high Pt alloy without the significant reduction of Ms from Pt diffusing into region 86.

After annealing, which is indicated by arrow 89, the resulting structure 88 has two graded regions 86 and 87, each with varying FePt containing alloy stoichiometry from top to bottom. In these regions 86, 87, darker shaded areas indicate higher relative concentrations of Fe. Annealing converts at least the second A1 FePt containing alloy layer 84 to an $L1_0$ phase region within 86. As previously described, the annealing can occur as part of layer deposition, e.g., heating a substrate while depositing respective materials 82-85 so that the annealing occurs contemporaneously with the material deposition. As before, the annealing can occur in range from about 200° C. to about 600° C. The annealing may occur at least on or about when the second layer 84 is being deposited, although heat may also be applied during some or all of the deposition of layers 81 and/or 85.

Figure 9:
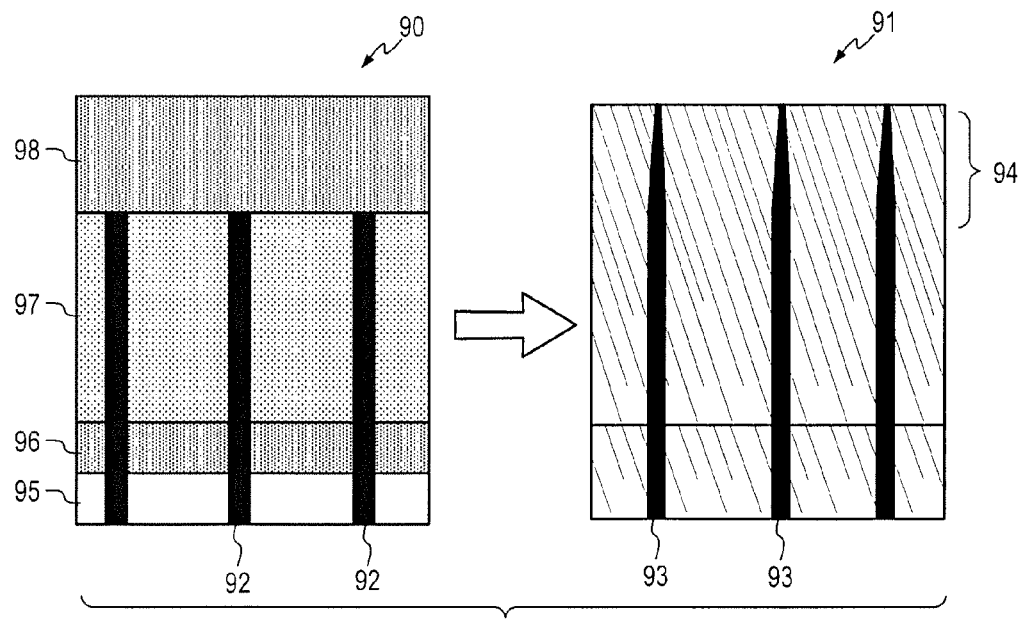

In reference now to FIG. 9, a schematic represents additional details about the example structure and process embodiments shown in FIG. 8. In FIG. 9, stacks 90, 91 represent respective pre- and post-anneal structures similar to 80 and 88 in FIG. 8. For example, layers 95-98 in structure 90 may be analogous to layers 82-85 shown in FIG. 8. In FIG. 9, vertical bands 92, 93 represent segregation/isolation material that separates grain boundaries. As seen in this view, the isolation material 92 is not deposited in the topmost layer of stack 90, although in other arrangements isolation material may be deposited but in lower concentrations than the lower layers. After annealing, the layers of stack 90 interdiffuse, so that the amount of segregant 93 in annealed stack 91 is the same, but is now spread between the layers and is thinner in top region 94. Thus, this region 94 has higher $M_s$ than nearby regions of recording stack 91 because in this region 94, Ms increases due to the increase in Fe concentration, and further increases due to the decrease in nonmagnetic volume. Although the pre-annealing amount of segregation of layers 82, 83, and 84 of FIG. 9 were shown as equal for clarity, it should be clear that in other embodiments the amount of segregant of different layers before annealing may be different.

Figure 10:
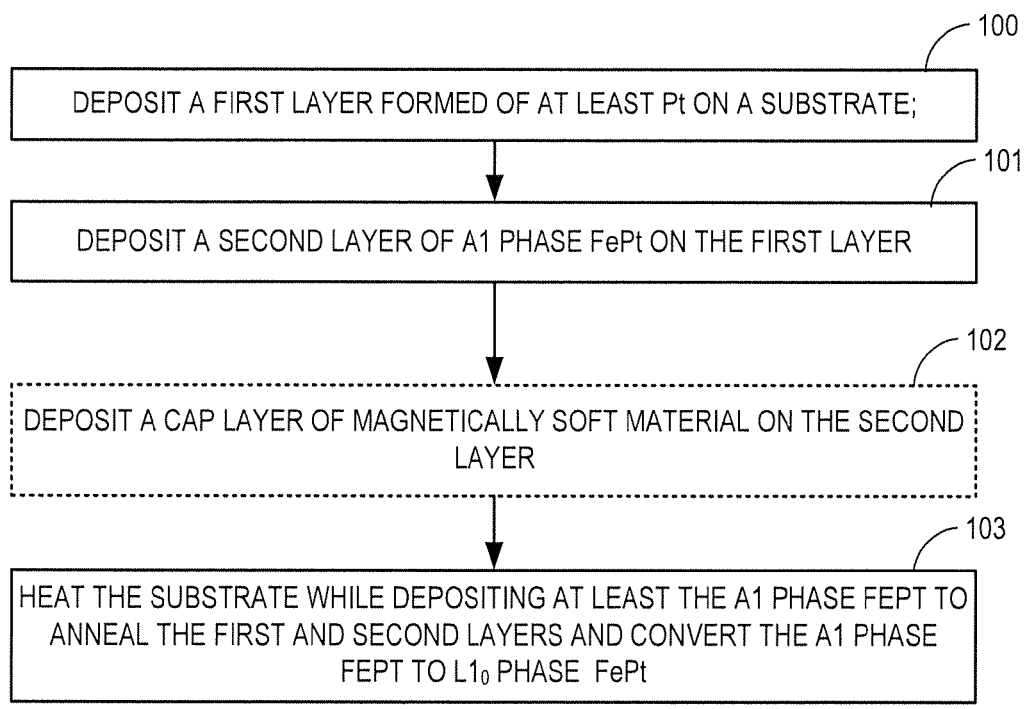
FIG. 10 is a flowchart illustrating a procedure according to an example embodiment.

In reference now to FIG. 10, a flowchart illustrates a procedure according to an example embodiment. The procedure involves depositing 100 a first layer formed of at least Pt (e.g., Pt or PtFe containing alloy) on a substrate. This may include a material of high or low Fe:Pt ratio. A second layer of A1 phase FePt containing alloy is deposited 101 on the first layer. A cap layer of magnetically soft material (e.g., FePt containing alloy with a high Fe:Pt ratio.) may optionally be deposited 102 on the second layer. The substrate is heated 103 while depositing at least the A1 phase FePt containing alloy the annealing the first and second layers and convert the A1 phase FePt containing alloy to $L1_0$ phase FePt containing alloy.

The annealing may cause the first and second layer to form a graded FePt containing alloy structure of varying stoichiometry (e.g., varying gradually in Fe:Pt ratio from top to bottom). The first layer may be formed of FePt containing alloy of a different stoichiometry than the second layer of L10 phase FePt containing alloy. For example, the first layer may be formed as a bilayer structure with first and second FePt containing alloy portions. The first FePt containing alloy portion is proximate the substrate and has a Fe:Pt ratio lower than that of the second layer. The second FePt containing alloy portion is proximate the second layer and has a Fe:Pt ratio higher than that of the second layer.

While the embodiments have been described in terms of several examples, it will be apparent to those skilled in the art that various changes can be made to the disclosed examples, without departing from the scope of the invention as set forth in the following claims. The implementations described above and other implementations are within the scope of the following claims.

What is claimed is:

1. A method comprising:
depositing a seed layer on a substrate, the seed layer comprising A1 phase FePt with a ratio of Pt to Fe greater than 1:1;
depositing a main layer on the seed layer, the main layer comprising A1 phase FePt with a ratio of Pt to Fe of approximately 1:1;
depositing a cap layer on the main layer, the cap layer comprising A1 phase FePt with a ratio of Pt to Fe of less than 1:1; and
annealing the seed, main and cap layers to convert the A1 phase FePt to $L1_0$ phase FePt having a graded FePt structure of varying stoichiometry from approximately $Fe_{50}Pt_{50}$ adjacent a lower portion of the structure proximate the substrate to $Fe_{>50}Pt_{<50}$ adjacent an upper portion of the structure opposite the lower portion.

2. The method of claim 1, further comprising heating the substrate prior to depositing at least one of the seed or main layers.

3. The method of claim 1, wherein the seed layer further comprises a nonmagnetic segregating material to provide stability during the annealing step, the nonmagnetic segregating material comprising at least one selected from the group consisting of carbon, a carbide, boron, a boride, an oxide, or a nitride.

4. The method of claim 1, wherein the main layer further comprises a nonmagnetic segregating material to provide stability during the annealing step, the nonmagnetic segregating material comprising at least one selected from the group consisting of carbon, a carbide, boron, a boride, an oxide, or a nitride.

5. The method of claim 4, wherein the cap layer further comprises the nonmagnetic segregating material of the main layer at a concentration that is lower than that of the main layer.

6. The method of claim 1, wherein the seed layer further comprises at least one selected from the group consisting of Au, Ag, Ru, Pd, Pt, V, Mo, W or Cu.

7. The method of claim 1, wherein the main layer has a first thickness, and the cap layer has a second thickness greater than the first thickness.

8. The method of claim 1, wherein the seed layer comprises first and second layers, the second layer contactingly disposed on the first layer, the first layer comprising the A1 phase FePt with a ratio of Pt to Fe greater than 1:1, and the second layer comprising A1 phase FePt with a ratio of Pt to Fe of less than 1:1.

9. The method of claim 1, wherein the cap layer further comprises Cu.

10. The method of claim 9, wherein after the annealing step the main and cap layers form a graded FePtCu composition.

11. The method of claim 1, wherein the annealing step occurs over a temperature range of from about 200 degrees C. to about 600 degrees C.

12. The method of claim 1, wherein the substrate comprises an underlying base material which supports a heatsink, wherein the seed, main and cap layers are supported by the heatsink.

13. A method for forming a recording medium, comprising:
providing a disc-shaped substrate;
forming a seed layer supported by the substrate by depositing a first material comprising A1 phase FePt with a ratio of Pt to Fe greater than 1:1;
forming a main layer supported by the seed layer by depositing a second material comprising A1 phase FePt with a ratio of Pt to Fe of approximately 1:1;
forming a cap layer supported by the main layer by depositing a third material comprising A1 phase FePt with a ratio of Pt to Fe of less than 1:1; and
annealing the seed, main and cap layers to convert the A1 phase FePt to $L1_0$ phase FePt having a graded FePt structure of varying stoichiometry from a ratio of Pt to Fe of approximately 1:1 adjacent a lower portion of the structure to a ratio of Pt to Fe of less than 1:1 adjacent an upper portion of the structure opposite the lower portion.

14. The method of claim 13, wherein the seed layer further comprises a nonmagnetic segregating material to provide stability during the annealing step.

15. The method of claim 13, wherein the main layer further comprises a nonmagnetic segregating material to provide stability during the annealing step.

16. The method of claim 15, wherein the cap layer further comprises the nonmagnetic segregating material of the main layer at a concentration that is lower than that of the main layer.

17. The method of claim 13, wherein the seed layer further comprises at least one selected from the group consisting of Au, Ag, Ru, Pd, Pt, V, Mo, W or Cu.

18. The method of claim 13, wherein the main layer has a first thickness, and the cap layer has a second thickness greater than the first thickness.

19. The method of claim 13, wherein the seed layer comprises first and second layers, the second layer contactingly disposed on the first layer, the first layer comprising the A1 phase FePt with a ratio of Pt to Fe greater than 1:1, and the second layer comprising A1 phase FePt with a ratio of Pt to Fe of less than 1:1.

20. The method of claim 13, wherein the cap layer further comprises Cu.

* * * * *